United States Patent [19]
Nakazawa

[11] Patent Number: 5,894,441
[45] Date of Patent: Apr. 13, 1999

[54] SEMICONDUCTOR MEMORY DEVICE WITH REDUNDANCY CIRCUIT

[75] Inventor: Shigeyuki Nakazawa, Tokyo, Japan

[73] Assignee: NEC Corporation, Tokyo, Japan

[21] Appl. No.: 09/050,354

[22] Filed: Mar. 31, 1998

[30] Foreign Application Priority Data

Mar. 31, 1997 [JP] Japan ..................... 9-081203

[51] Int. Cl.$^6$ ......................... G11C 7/00
[52] U.S. Cl. ............ 365/200; 365/230.03; 365/230.06
[58] Field of Search ......................... 365/200, 201, 365/230.03, 230.06

[56] References Cited

U.S. PATENT DOCUMENTS

| | | | |
|---|---|---|---|
| 5,349,556 | 9/1994 | Lee | 365/200 |
| 5,355,339 | 10/1994 | Oh et al. | 365/200 |
| 5,359,560 | 10/1994 | Suh et al. | 365/200 |
| 5,798,974 | 8/1998 | Yamagata | 365/200 |
| 5,808,948 | 9/1998 | Kim et al. | 365/200 |

*Primary Examiner*—Vu A. Le
*Attorney, Agent, or Firm*—Sughrue, Mion, Zinn, Macpeak & Seas, PLLC

[57] ABSTRACT

A semiconductor memory device which enhances the relief efficiency of defective bit lines by means of redundant bit lines is disclosed. To a column redundancy decoder are supplied not only a Y address but also a part of an X address. When a Y address corresponding to a defective bit line is supplied to the column redundancy decoder, the column redundancy decoder generates a detection signal. In this case, replacement by means of a redundant bit line is carried out if the part of the X address indicates a region where the defective bit line exists, and the replacement by means of a redundant bit line will not take place if it indicates a region where the defective bit line does not exists.

15 Claims, 8 Drawing Sheets

SEMICONDUCTOR MEMORY DEVICE WITH REDUNDANCY CIRCUIT

FIELD OF THE INVENTION

The present invention relates to a semiconductor memory device equipped with a redundancy circuit, and more particularly, to a semiconductor memory device having an enhanced relief efficiency of a defective bit line by means of a redundant bit line.

BACKGROUND OF THE INVENTION

Accompanying fine geometry, high integration, and large capacity of the semiconductor memory devices in recent years, it is becoming extremely difficult to obtain perfect products which are absolutely free from defects. In other words, almost all of the produced semiconductor memory devices include defective memory cells, defective work lines, or defective bit lines. In order to make it possible to deliver semiconductor memory devices that include such defects as acceptable products, it is a general practice to provide the semiconductor memory device with a redundancy circuit.

The redundancy circuit is for disabling the use of a defective word or bit line when there exists one, and replacing the defective word or bit line with a redundant word or bit line. By designing a circuit configuration such that a defective word line or a defective bit line can be replaced by a redundant word line or a redundant bit line, as in the above, it is possible to deliver a semiconductor memory device as if it is absolutely free from defectiveness. Accordingly, a redundancy circuit contributes significantly to the enhancement of the yield of the semiconductor memory devices.

In order to relieve as many defective word lines or defective word lines or defective bit lines as possible, it is most effective to incorporate as many redundant word lines or redundant bit lines as its practicable. However, since the redundancy circuit is a superfluous circuit in the sense that it is useless unless there exists defectiveness in the manufactured semiconductor memory device, it is not recommended to provide a large scale redundancy circuit within the semiconductor memory device. For this reason, it is desirable to relieve as many defective word lines or defective bit lines as possible with a minimum number of redundant word lines or redundant bit lines.

Under those circumstances, a variety of methods for improving the relief efficiency of defective word lines or defective bit lines by means of a redundant circuit have been proposed. As examples, there may be mentioned methods disclosed in U.S. Pat. No. 5,349,556, U.S. Pat. No. 5,355, 339, U.S. Pat. No. 5,359,560, and U.S. Pat. No. 5,414,660. The method described in these patents is what is called the row flexible redundancy method. The row flexible redundancy method is a technique for efficiently relieving the word line defects, which has a feature in that the range of replacement covered by one redundant word line is broad.

However, according to the row flexible redundancy method, the relief efficiency for defective bit lines remains unchanged, although the relief efficiency for defective word lines can be improved. Because of this, a method which can also improve the relief efficiency for defective bit lines is in demand.

SUMMARY OF THE INVENTION

It is an object of the present invention to provide a semiconductor memory device equipped with a redundancy circuit having a high relief efficiency.

It is another object of this invention to provide a semiconductor memory device by which defective bit lines can be relieved by a smaller number of redundant bit lines.

It is still another object of this invention to provide a semiconductor memory device which is capable of relieving a larger number of defective bit lines while minimizing the increase in the chip area.

It is still another object of this invention to provide a semiconductor memory device equipped with a redundant circuit which is capable of improving the relief efficiency for defective bit lines while employing a row flexible redundancy circuit.

The semiconductor memory device according to this invention comprises a plurality of column selection lines, at least one redundant column selection line, a column decoder which activates one line out of the plurality of column selection lines in response to a column address, a first circuit which generates a detection signal when the column address of a defect-related column selection line is supplied, and a second circuit which receives at least a part of a row address, and activates the redundant column selection line in response to at least a part of the row address and the detection signal. With this arrangement, when defect occurs in one bit line, instead of replacing all of the many bit lines included in the column selection line to which the defective bit line belongs, it is possible to relieve a larger number of defective bit lines using a single redundant column selection line by replacing only a part of these bit lines.

BRIEF DESCRIPTION OF THE DRAWINGS

The above and other objects, advantages and features of the present invention will be apparent from the following description taken in conjunction with the accompanying drawings, in which.

DETAILED DESCRIPTION OF THE PREFERRED EMBODIMENTS

First, referring to FIG. 1, the semiconductor memory device 100 which is the object of application of this invention will be described prior to detailed description of the semiconductor memory device of this invention.

Figure 1:
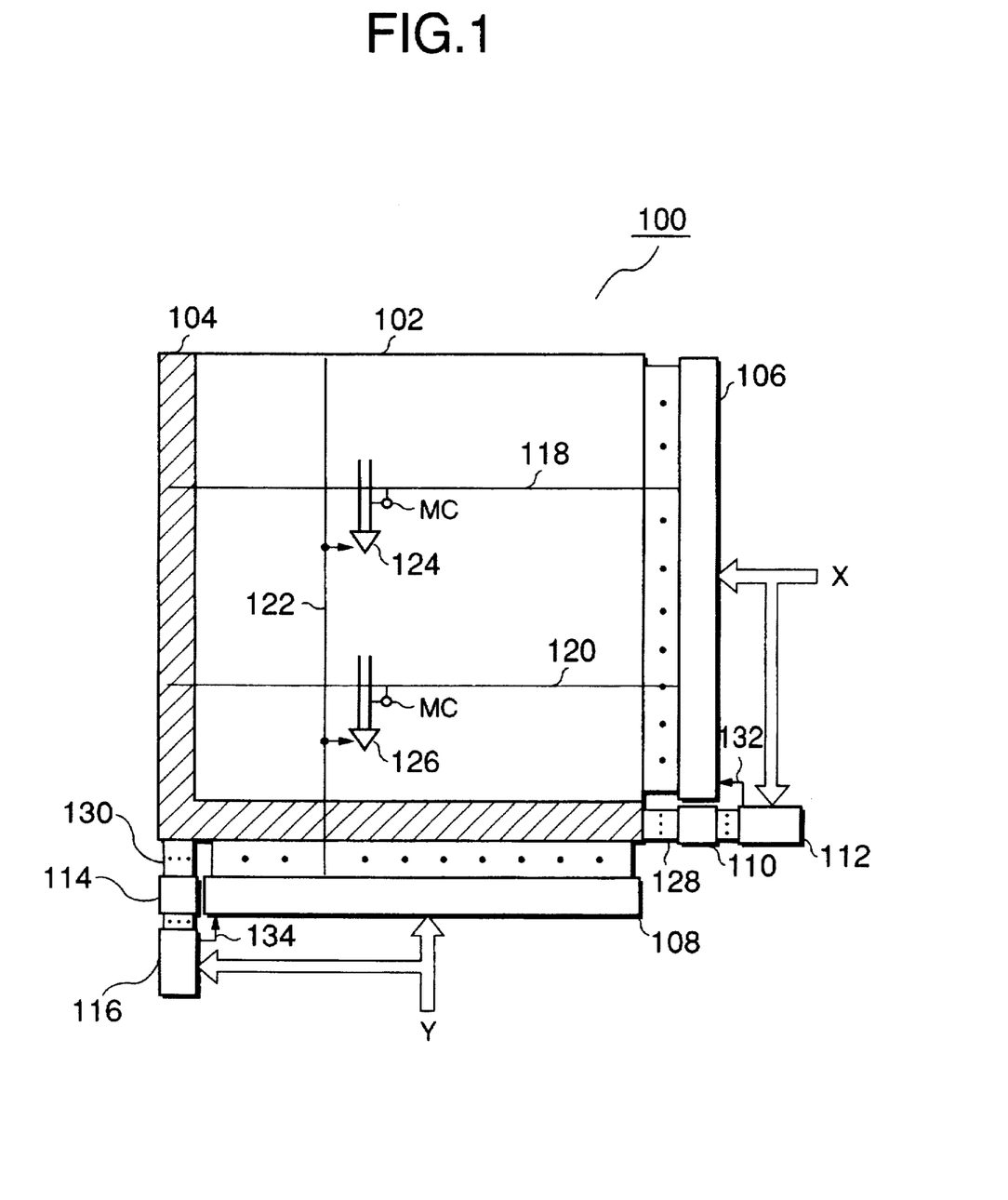
FIG. 1 is a block diagram showing a semiconductor memory device 100 with divided bit lines, which is an object of this invention.

A semiconductor memory device 100 shown in FIG. 1 is a semiconductor memory device with divided bit lines. The cell array region of the semiconductor memory device 100 consists of a normal cell array region 102 and a redundant cell array region 104.

An X address (row address) is supplied to a row decoder 106 and a row redundancy decoder 112, and a Y address (column address) is supplied to a column decoder 108 and a column redundancy decoder 116. Upon receipt of the X address the row decoder 106 activates one word line corresponding to the X address out of a plurality of word lines. In FIG. 1, only word lines 118 and 120 are indicated for convenience. On the other hand, upon receipt of a Y address, the column decoder 108 activates one column selection line corresponding to the Y address out of a plurality of column selection lines. In FIG. 1, only the column selection line 122 is indicated for convenience.

Many memory cells MC are connected to each of the word lines 118 and 120, and respective memory cells MC are connected to sense amplifiers 124, 126, and the like.

Here, it is to be noted that the column selection line 122 activates the plurality of sense amplifiers 124, 126, and the like. That is, in the same column, a bit line is divided into plural parts, and the column decoder 108 selects all the sense amplifiers connected to the plurality of divided bit lines, in response to the Y address. Although only two bit lines are indicated in FIG. 1 for convenience, it will be assumed that the number of divided bit lines is actually 16. In other words, when the column selection line 122 is activated in response to a Y address, 16 sense amplifiers are selected simultaneously. However, only the data corresponding to an activated word line is selected finally out of the 16 selected sense amplifiers, and is readout.

The row redundancy decoder 112 detects the supply of the X address corresponding to a defective word line. The row redundancy decoder 112 includes a plurality of fuse elements, and stores the X address corresponding to a defective word line according to whether or not these fuses are blown out. Namely, when the X address corresponding to a defective word line is supplied, the row redundancy decoder 112 supplies an inhibit signal 132 to the row decoder 106 to deactivate the row decoder 106, and activates a redundant word line driver 110 to activate a specified redundant word line 128. In this way, the defective word line is replaced by the redundant word line 128.

On the other hand, the column redundancy decoder 116 detects the supply of the Y address corresponding to a defective bit line. The column redundancy decoder 116 also includes a plurality of fuse elements, and stores the Y address corresponding to a defective bit line according to whether or not these fuses are blown out. In other words, when the Y address corresponding to the defective bit line is supplied, the decoder 116 deactivates the column decoder 108 by supplying an inhibit signal 134 to the column decoder 108, and activates the redundant column selection driver 114 in order to activate a specified redundant column selection line 130. In this way, the defective bit line is replaced by a redundant bit line (not shown) corresponding to the redundant column selection line 130.

However, such a semiconductor memory device 100 has the following problem. Namely, if one bit line is defective, not only the defective bit line but also other bit lines that share the column selection line are replaced to the redundant bit lines. More specifically, as a result of defect in a bit line, for example, the bit line corresponding to the sense amplifier 124, all of the 16 bit lines selected by the same column selection line 122 are disabled, and all of the 16 bit lines are replaced to the redundant bit lines. Thus, many redundant bit lines will be wasted for a small number of bit line defects. In effect, it leads to the problem of deterioration of the relief efficiency of the defective bit lines.

In the semiconductor memory devices according to each of the embodiments that will be described in the following, the above problem is resolved to realize a high relief efficiency.

Figure 2:
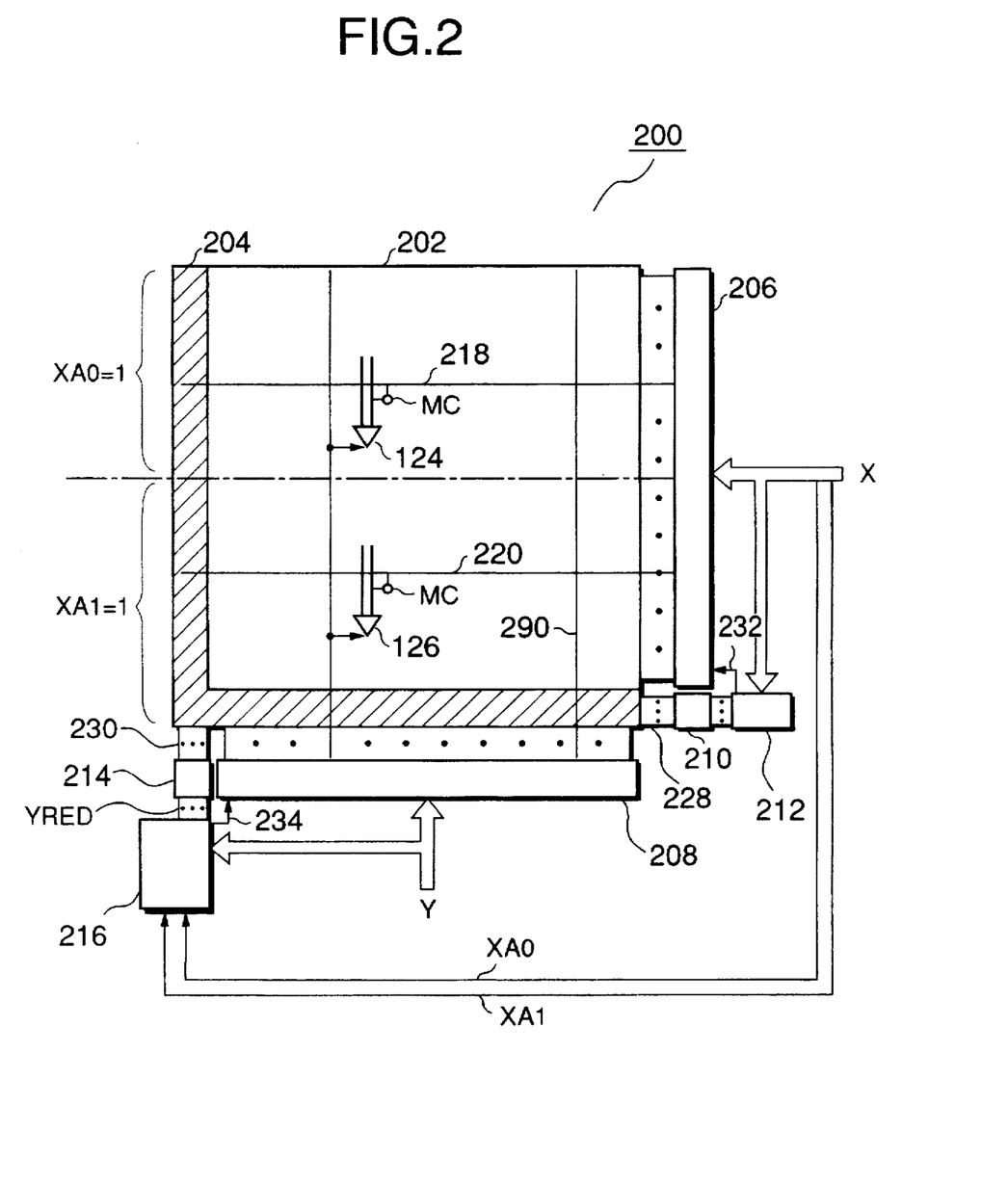
FIG. 2 is a block diagram showing a semiconductor memory device 200 according to a first embodiment of this invention.

The semiconductor memory device according to a first embodiment of this invention 200 has a feature in that a column redundancy decoder 216 receives not only a Y address but also a part of an X address, as shown in FIG. 2. The remaining portions are basically the same as that of the semiconductor memory device 100 shown in FIG. 1.

Namely, the semiconductor memory device 200 shown in FIG. 2 is a semiconductor memory device with divided bit lines, and the cell array region consists of a normal cell array region 202 and a redundant cell array region 204.

In addition to an X address being supplied to a row decoder 206 and a row redundancy decoder 212, XA0 and XA1 which show the logical level of the most significant bit of the X address are supplied also to the column redundancy decoder 216. As mentioned above, XA0 and XA1 are signals showing the logical level of the most significant bit of the X address, in which XA0 is "1" and XA1 is "0" when the most significant bit of the X address is 0, and on the contrary, XA0 is "0" and XA1 is "1" when the most significant bit of the X address is 1. In short, XA0 and XA1 are mutually complementary signals.

On the other hand, a Y address is supplied to a column decoder 208 and the column redundancy decoder 216.

Upon receipt of the X address, the row decoder 206 activates one word line corresponding to the X address out of a plurality of word lines. In FIG. 2, only word line 218 and word line 220 are indicated for convenience. On the other hand, upon receipt of the Y address, the column decoder 208 activates one column selection line corresponding to the Y address out of a plurality of column selection lines. In FIG. 2, column selection lines 222 and 290 alone are indicated for convenience.

Each of the word lines 218, 220, and the like is connected to a memory cell MC, and each memory cell MC is connected to a corresponding one of sense amplifiers 224, 226, and the like.

In the semiconductor memory device 200 shown in FIG. 2, the column selection line 222 activates, as before, a plurality of sense amplifiers 224, 226, and the like. That is, analogous to the semiconductor memory device 100, a bit line is divided into plural parts in the same column, and the column decoder 208 selects all the sense amplifiers connected to a plurality of divided bit lines in response to the Y address. Although only two bit lines are indicated in FIG. 2 for convenience, it will be assumed that a bit line is actually divided into 16 parts as before. Namely, when the column selection line 222, 290, or the like is activated in response to a Y address, 16 sense amplifiers are selected simultaneously. Data corresponding only to the activated word line is selected finally out of the 16 sense amplifiers, and is read out.

The row redundancy decoder 212 detects the supply of the X address corresponding to a defective word line. The row redundancy decoder 212 contains a plurality of fuse elements, and stores the X address corresponding to defective word lines depending upon whether or not these fuses are blown out. Typically, polysilicon is used for these fuses, but the present invention is not limited to this choice, and permits the use of any kind of material for the fuses. In addition, although laser irradiation is employed typically as the method of fuse bow-out, this invention is not limited to this case, and permits the use of any type of blow-out method. For example, the fuse may be blown out by the passing of a large current in the fuse.

When an X address corresponding to a defective word line is received, the row redundancy decoder 212 deactivates the row decoder 206 by supplying an inhibit signal 232 to the row decoder 206, and activates a redundant word line driver 210 in order to activate a specified redundant word line 228. As a result, the defective word line is replaced to the redundant word line 228. Accordingly, it will look as if there exists no defect when seen from the outside.

Figure 3:
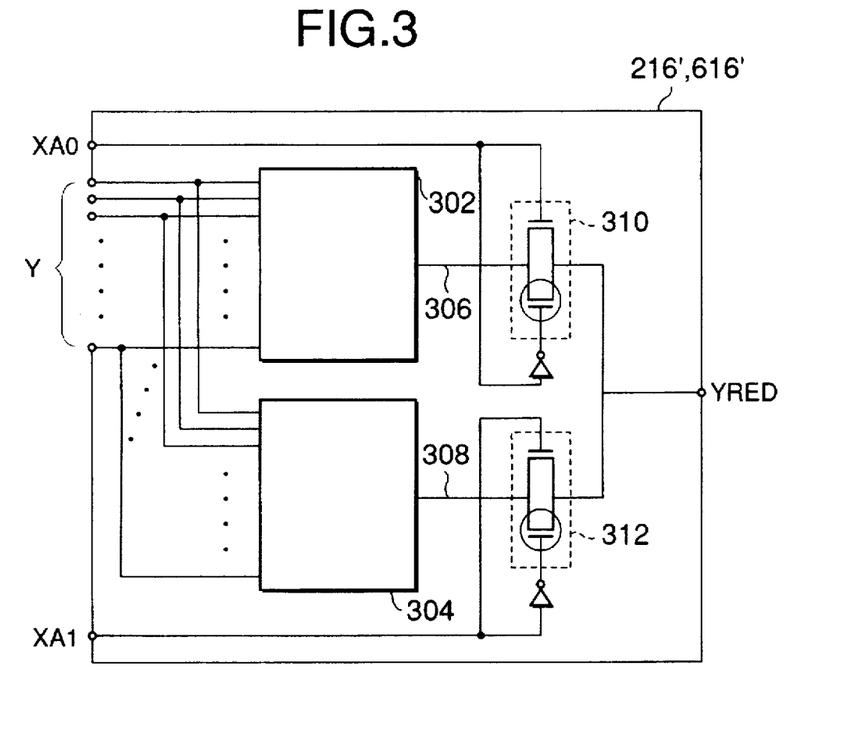
FIG. 3 is a circuit diagram showing a part of a column redundancy decoder 216 in FIG. 2.

In the meantime, the column redundancy decoder 216 detects that a Y address corresponding to a defective bit line is supplied. Referring to FIG. 3, a specific circuit diagram and the operation of the column redundancy decoder 216 will be described.

FIG. 3 shows a specific circuit configuration of the column redundancy decoder 216, but it does not show the all circuit parts that are included in the column redundancy decoder 216. Namely, the column redundancy decoder 216' shown in FIG. 3 illustrates only the circuit part corresponding to one redundant column selection line YRED of the column redundancy decoder 216. According, in the decoder 216, there actually exist as many column redundancy decoders 216' as equals to the number of the redundant column selection lines YRED. For example, if there exist 8 redundant column selection lines YRED, 8 column redundancy decoders 216' are needed, and if there exist 16 redundant column selection lines YRED, then 16 column redundancy decoders 216' are needed.

Figure 4:
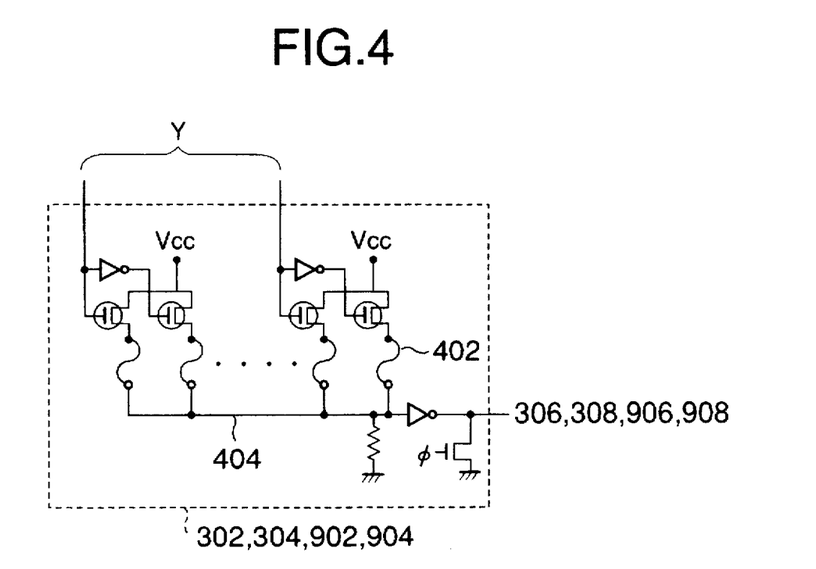
FIG. 4 shows a fuse blocks 302 and 304 shown in FIG. 3.

As shown in FIG. 3, two fuse blocks 302 and 304 are included in the column redundancy decoder 216', and the Y address is supplied in common to these fuse blocks 302 and 304. A specific circuit configuration of these fuse blocks 302 and 304 is as shown in FIG. 4. As shown in FIG. 4, in the fuse blocks 302 and 304 are included a plurality of fuses 402, and the Y address of a defective bit line is stored by programming the Y address of the defective bit line in these fuses 402. Namely, when the Y address of a defective bit line is supplied to the fuse blocks 302 and 304 where the Y address of the defective bit line is programmed, a wiring 404 goes to the ground potential, and matching signals 306 and 308 go to a high level (active level). In contrast, when an address different from the Y address of the defective bit line is supplied to the fuse blocks 302 and 304, the wiring 404 is held at a potential Vcc, and the matching signals 306 and 308 are held at a low level (inactive level).

That the material and the blow-out method to be employed by the fuse 402 are not limited is similar to the case of the row redundancy decoder 212.

As shown in FIG. 3, the column redundancy decoder 216' further includes two transfer gates 310 and 312. The transfer gate 310 outputs the matching signal 306 as the YRED when XA0 is at the high level, and the transfer gate 312 outputs the matching signal 308 as the YRED when XA1 is at the high level. As mentioned above, XA0 and XA1 are complementary signals showing the logical level of the most significant bit of the X address, so that either one of the transfer gates 310 or 312 is necessarily in the energized state and the other is in the deenergized state.

Although it is not explicitly indicated in FIG. 3, when a YRED goes to the high level (active level), the inhibit signal 234 goes to the active level, and inhibits the operation of the column decoder 208.

Next, the replacement operation of a defective bit line is the semiconductor memory device 200 will be described.

As an example, the case in which a bit line corresponding to the sense amplifier 224 is defective will be described. In this case, the bit line corresponding the column selection line 222 is defective, so the Y address corresponding to the column selection line 222 is programmed in the column redundancy decoder 216. What is important at this time is to program this Y address in the fuse block 302 within the column redundancy decoder 216.

After programming in this manner, when the memory cell MC corresponding to the defective bit line is accessed, the fuse block 302 brings the matching signal 306 to the high level by detecting the matching of the Y signals. Further, since the defective bit line belongs to the cell array region where the most significant bit of the X address is 0, XA0 is "1", and the transfer gate 310 goes to the energized state. Accordingly, the YRED goes to the active level, and corresponding to this, the redundant column selection line drive 214 activates the specifies redundant column selection line 230. On the other hand, the operation of the column decoder 208 is inhibited by the inhibit signal 234.

As a result, the defective bit line is replaced to a redundant bit line belonging to the redundant column selection line.

On the other hand, when a memory cell connected to a bit line belonging to a cell array region where the most significant bit of the X address is "1", among the other bit lines corresponding to the column selection line 222, is accessed, the replacement of the bit line is not carried out. The reason for this is that, although the fuse block 302 activates the matching signal 306 as a result of matching of the Y addresses, the transfer gate 310 is deenergized in this case, and the YRED is not activated. As a result of the nonactivation of the YRED, the inhibit signal 234 is not activated either, and the column decoder 208 carries out the normally operation.

In this connection, it should be noted that the above fact means that only half of the bit lines, namely, only those bit lines belonging to the cell array region where the most significant bit of the X address is "1", out of the bit lines corresponding to the column selection line 222, are replased to the redundant bit lines.

Here, the case in which another bit line, for example, a bit line belonging to the cell array region where the most significant bit of the X address is "1" among the bit lines belonging to the column selection line 290, is defective, will be described. In this case, since a bit line corresponding to the column selection line 290 is defective, the Y address corresponding to the column selection line 290 is programmed in the column redundancy decoder 216. What is important at this time is to program the Y address in the fuse block 304 in the column redundancy decoder 216.

After programming as in the above, when the memory cell corresponding to the defective bit line is accessed, the fuse block 304 brings the matching signal 308 to the high level by detecting the matching of the Y addresses. Since the defective bit line belongs to the cell array region where the most significant bit of the X address is "1" as mentioned above, XA1 is "1" so that the transfer gate 312 is energized. As a result, the YRED is activated, and in response to this, the redundant column selection line driver 214 activates the specified redundant column selection line 230. On the other hand, the operation of the column decoder 208 is inhibited by the inhibit signal 234.

In contrast to the above, when a memory cell connected to a bit line belonging to the cell array region where the most significant bit of the X address is 0, among the other bit lines corresponding to the column selection line 290, is accessed, the replacement of the bit line does not take place. The reason for this is that, although the fuse block 304 activates the matching signal 308 because of the matching of the Y addresses, the transfer gate 312 is deenergized in this case, so that the YRED is not activated. Because of the nonactivation of the YRED, the inhibit signal 234 is not activated either, and the column decoder 208 carries out the normal operation.

Attention is to be drawn again to the fact that this means that only half of bit lines, namely, bit lines belonging to the cell array region where the most significant bit of the X address is "1", among the bit lines corresponding to the column selection line 290, can be replased to the redundant bit lines.

Figure 5:
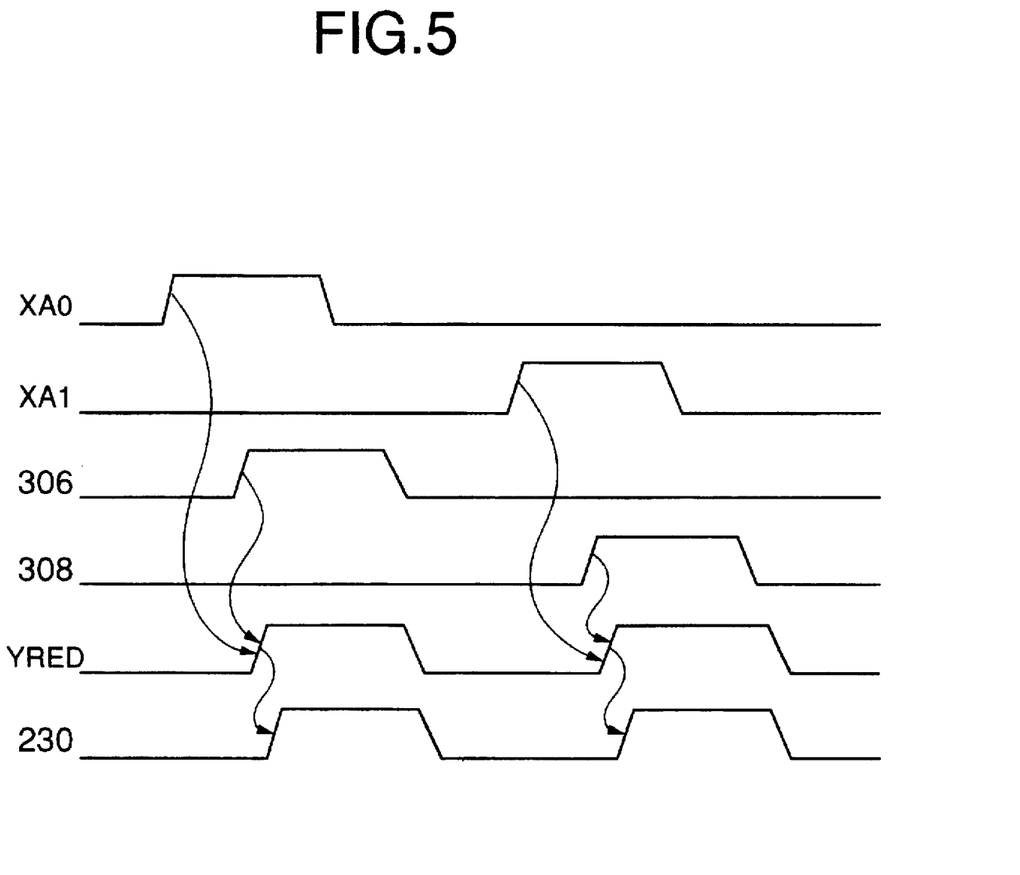
FIG. 5 is a timing chart showing the timings for bit line replacement by the semiconductor memory device 200.

The above operation will be understood more clearly by examining the timing chart shown in FIG. 5. From FIG. 5 it can be seen that the matching signal 306 is generated only during the time when XA0 is active, whereas the matching signal 308 is generated only during the time when XA1 is active.

In other words, half of the single redundant column selection line 230 replaces half of the column selection line 222, and the remaining half of the same redundant column selection line 230 replaces half of the column selection line 290. In this manner, by replacing only half, rather than all, of the column selection lines that include a defective bit line, in response to the X address to which the defective bit line belongs, two bit line defects with mutually different column selection lines can be replaced to means of a single redundant column selection line. Consequently, the relief efficiency of the defective bit lines can be doubled.

More specifically, when the redundant column selection lines equal in number to the redundant column selection lines contained in the semiconductor memory device 100 are installed in the semiconductor memory device 200, it is possible to relieve twice as many defective bit lines as the semiconductor memory device 100 can. Accordingly, the relief efficiency can be enhanced accompanied by little increase in the chip area. Further, even when half as many redundant column selection lines as contained in the semiconductor memory device 100 are installed in the semiconductor memory device 200, it is possible to relieve the same number of defective bit lines as is done by the semiconductor memory device 100. Accordingly, it is possible to reduce the chip area without deteriorating the relief efficiency.

In the semiconductor memory device 200, defective bit lines are flexibly replaced using the most significant bit of the X address. However, this invention is not limited to this choice, and a defective bit line may be replaced flexibly by using, for example, the highest order two bits of the X address. Moreover, a defective bit line may be replased to using the highest order three bits of the X address. When the replacement of a defective bit line is carried out using the highest order two bits of the X address, the relief efficiency of the defective bit lines will be quadrupled, and when the highest order three bits of the X address are used, the relief efficiency of the defective bit lines will be octupled. However, when the highest order two bits of the X address are used, the number of fuse blocks to be included in the column redundancy decoder 216' has to be made 4, and when the highest order three bits of the X address are used, the number of fuse blocks to be included in the column redundancy decoder 216' has to be made equal to 8. Accordingly, the number of fuse blocks cannot be allowed to increase without limit when no margin is available for the space to arrange the fuse blocks, although it will cause no problem when there is a sufficient margin for such a space is available. Eventually, the decision as to the number of higher order bits to be used of the X address should be determined by the trade-off between the available margin for arranging the fuse blocks and the anticipated number of generated defective bit lines.

As in the above, the area required by the peripheral circuit region is increased in response to the used bit numbers of the X address. In general, however, the peripheral circuit region has a larger space margin than the cell array region, so that there occurs little increase in the chip area when the most significant bit of the X address is used as in the semiconductor memory device 200.

Next, referring to FIG. 6, the semiconductor memory device 600 according to a second embodiment of this invention will be described.

Figure 6:
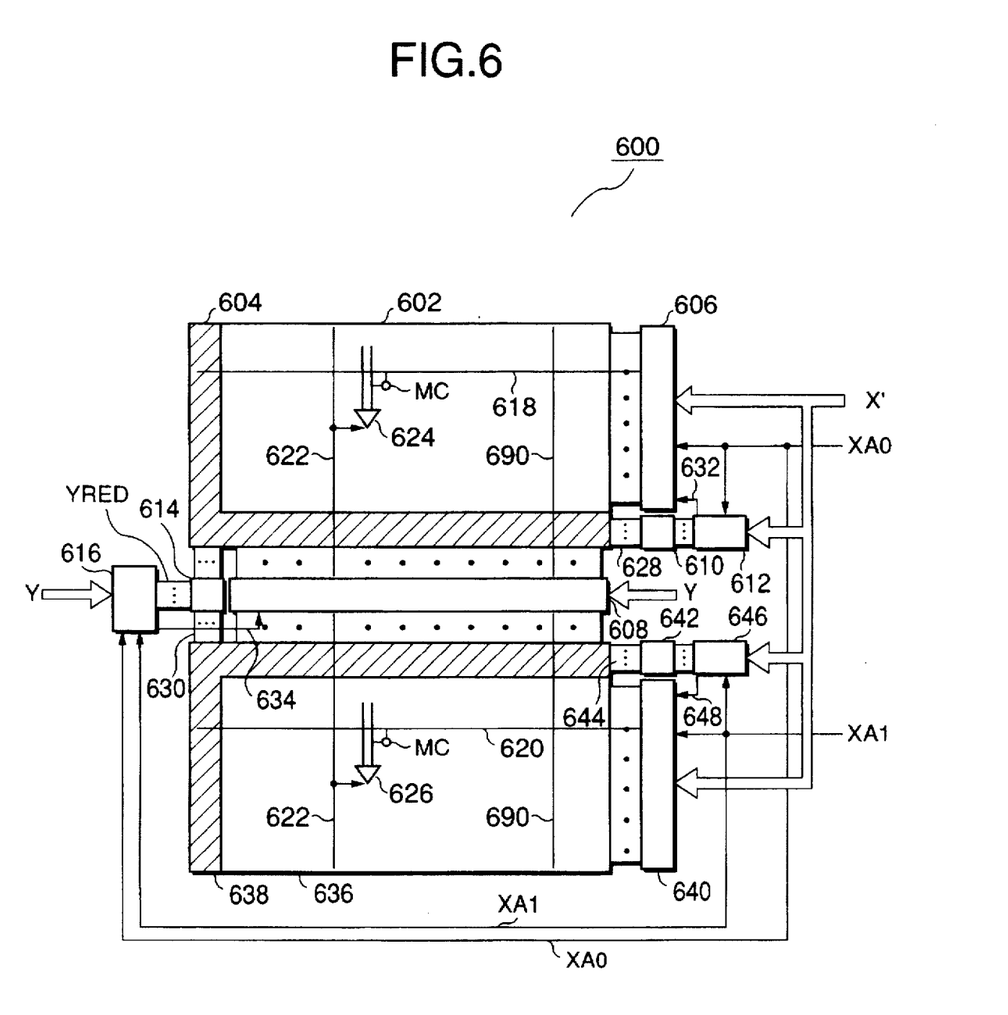
FIG. 6 is a block diagram showing a semiconductor memory device 600 according to a second embodiment of this invention.

As shown in FIG. 6, in the semiconductor memory device 600 according to the second embodiment of this invention, the cell array region is subdivided into two parts, and a column decoder 608 and a redundant column selection line driver 614 are arranged in the region sandwiched between the two cell array regions. Each of these cell array regions has its own redundant cell array region. Namely, the upper cell array region consists of a normal cell array region 602 and a redundant cell array region 604, and the lower cell array region consists of a normal cell array region 636 and a redundant cell array region 638.

Of these two cell array regions, a row decoder 606 and a row redundancy decoder 612 are installed corresponding to the upper cell array region, and a row decoder 640 and a row redundancy decoder 646 are installed corresponding to the lower cell array region. An address (X' address) excluding the most significant bit of the X address is supplied in common to these decoders on the X side XA0 indicating the most significant bit of the X address is supplied to the row decoder 606 and the row redundancy decoder 612, and XA1 indicating the most significant bit of the X address is supplied to the row decoder 640 and the row redundancy decoder 646.

The row decoder 606 is activated when XA0 is "1" and activates, in response the X' address, one word line corresponding to the X' address out of a plurality of word lines. In FIG. 6, only word line 618 is indicated in the upper cell array region for convenience. On the other hand, the row decoder 640 is activated when XA1 is "1", and activates one word line corresponding to the X' address out of a plurality of word lines, in response to the X' address. In FIG. 6, only word line 620 is indicated for convenience in the lower cell array region.

Upon receipt of a Y address the column decoder 608 activates one column selection line corresponding to the Y address out of a plurality of column selection lines. In FIG. 6, only column selection lines 622 and 690 are indicated for convenience.

A large number of memory cells MC are connected to each of the word lines 618, 620, and the like, and respective memory cells MC are connected to sense amplifiers 624, 626, and the like.

In the semiconductor memory device 600 shown in FIG. 6, too, a single column selection line 622 activates the plurality of sense amplifiers 624, 626, and the like. In other words, analogous to the semiconductor memory devices 100 and 200, a bit line is divided into a plurality of parts in the same column, and the column decoder 608 selects, in response to the Y address, all the sense amplifiers connected to the plurality of divided bit lines. Although only two bit lines are indicated in FIG. 6 for convenience, it will be assumed that a bit line is actually divided into 16 parts. Namely, when the column selection line 622 or 690 is activated in response to the Y address, 16 sense amplifiers are selected simultaneously. Only data that correspond to the activated word line, out of the 16 selected sense amplifiers, is selected eventually, and is read out. In the semiconductor memory device 600, the cell array region is divided into two parts, so that one column selection line selects sense amplifiers contained in the lower cell array region at the same time with the selection of eight sense amplifiers contained in the upper cell array region.

The operation of the row redundancy decoders 612 and 646 is the same as that of the row redundancy decoder 212. Namely, when an X address corresponding to a defective word line is supplied, these decoders 612 and 646 deactivate the row decoders 606 and 640 by supplying inhibit signals 632 and 648 to the row decoders 606 and 640, respectively, and activate redundant word line drivers 610 and 642 in order to activate specified redundant word lines 628 and 644. In this way, the defective word line is replased to the redundant word line 628. Accordingly, it looks as if there is no defect in the word lines when viewed from the outside.

In the semiconductor memory device 600, the row flexible redundancy method is adopted. Namely, when the word line 618 included in the normal cell array region 602 is defective, the redundant word line to be used for replacement is not limited to the redundant word line 628 included in the redundant cell array region 604, but can be the redundant word line 644 included in the redundant cell array region 638. As a result, the relief efficiency of the defective word lines can be enhanced. A specific configuration for realizing the row flexible redundancy method is well-known as mentioned above, so that the detail is not shown in FIG. 6. Moreover, the row flexible redundancy method may be realized by employing any kind of circuit configuration.

Furthermore, a column redundancy decoder 616 has a circuit configuration the same as that of the column redundancy decoder 216 described in connection with the first embodiment.

In the semiconductor memory device 600 of this embodiment, the relief efficiency for the defective bit line can be enhanced similar to the case of the semiconductor memory device 200 of the first embodiment.

Namely, when a bit line corresponding to the sense amplifier 624 is defective, for example, it means that a bit line corresponding to the column selection line 622 is defective, so that the Y address corresponding to the column selection line 622 is programmed in the column redundancy decoder 616. In this case, the Y address is programmed in the fuse block 302 within the column redundancy decoder 616, the same as in the first embodiment.

Furthermore, when another bit line, for example, a bit line belonging to the lower cell array region among the bit lines belonging to the column selection line 690 is defective, the Y address corresponding to the column selection line 690 is programmed in the column redundancy decoder 616. In this case, the Y address is programmed in the fuse block 304 of the column redundancy decoder 616, the same as in the first embodiment.

The replacement operation after such a programming is similar to that for the semiconductor memory device 200 in the first embodiment. Namely, when a memory cell MC corresponding to the sense amplifier 624 is accessed, YRED is activated, and in response to this, the redundant column selection driver 614 activates the specified redundant column selection line 630. On the other hand, when a memory cell MC connected to a bit line belonging to the lower cell array region, among other bit lines corresponding to the column selection line 622, is accessed, replacement of the bit line will not take place. Moreover, when a memory cell MC corresponding to the column selection line 690 in the lower cell array region is accessed, YRED is activated, in response to this the redundant column selection line driver 614 activates the specified redundant column selection line 630. On the other hand, when a memory cell MC connected to a bit line belonging to the lower cell array region, among other bit lines corresponding to the column selection line 690, is accessed, replacement of the bit line will not take place.

From the description in the above, it will also be clear in this embodiment which employs the row flexible redundancy method that one column selection line replaces two column selection lines at the same time. In other words, instead of replacing all of the column selection lines which includes a defective bit line, two defective bit lines with mutually different column selection lines are replased to means of one redundant column selection line, by replacing half of the column selection lines in response to the X address to which the defective bit line belongs. Accordingly, the relief efficiency for the defective bit lines is doubled.

Since the flexible redundancy method is adopted on the row side, and the relief efficiency on the column side is enhanced in addition, this embodiment has a feature that both of the relief efficiency of defective bit lines and the relief efficiency of defective word lines are high.

Although very high relief efficiency can be realized for the column side as well as for the row side according to the semiconductor memory device 600 of this embodiment, this embodiment is under one restriction. It is the restriction that when a defective word line replacement is carried out using a redundant word line belonging to the cell array region different from that of the defective word line, by means of the row flexible redundancy method, defectiveness in a bit line intersecting the redundant word line cannot be relieved.

To describe the situation in more detail, consider the case in which defectiveness in the word line 618 contained in the upper cell array region is replased to the redundant word line 644 contained in the lower cell array region. In this case, when the X address corresponding to the defective word line 618 is supplied from outside the device, it will strictly appear when viewed from outside the device as if a word line contained in the upper cell array region is selected, despite the fact that the redundant word line 644 contained in the lower cell array region is selected. That is to say, in spite of the fact that the lower cell array region is selected, XA0 persists to be "1".

In the means time, the reason for enabling the column redundancy decoder 616 to relieve the defective bit lines with high efficiency, as described in the above, is due to the fact that the replacement of two column selection lines by a single redundant column selection line is made possible by making reference as to whether the defective bit line belongs to the cell array region where XA0 is "1", or to the cell array region where XA1 is "1". Accordingly, it is necessary that XA0, XA1 and the cell array region actually accessed match with each other.

However, when replacement to a redundant word line contained in the different cell array region is carried out by the row flexible redundancy method, and a bit line intersecting the redundant word line is defective, XA0, XA1 and the cell array region actually accessed do not match each other, so that it is not possible to relieve the defective bit line. However, such a situation is extremely rare, so it will hardly cause any problem.

Figure 7:
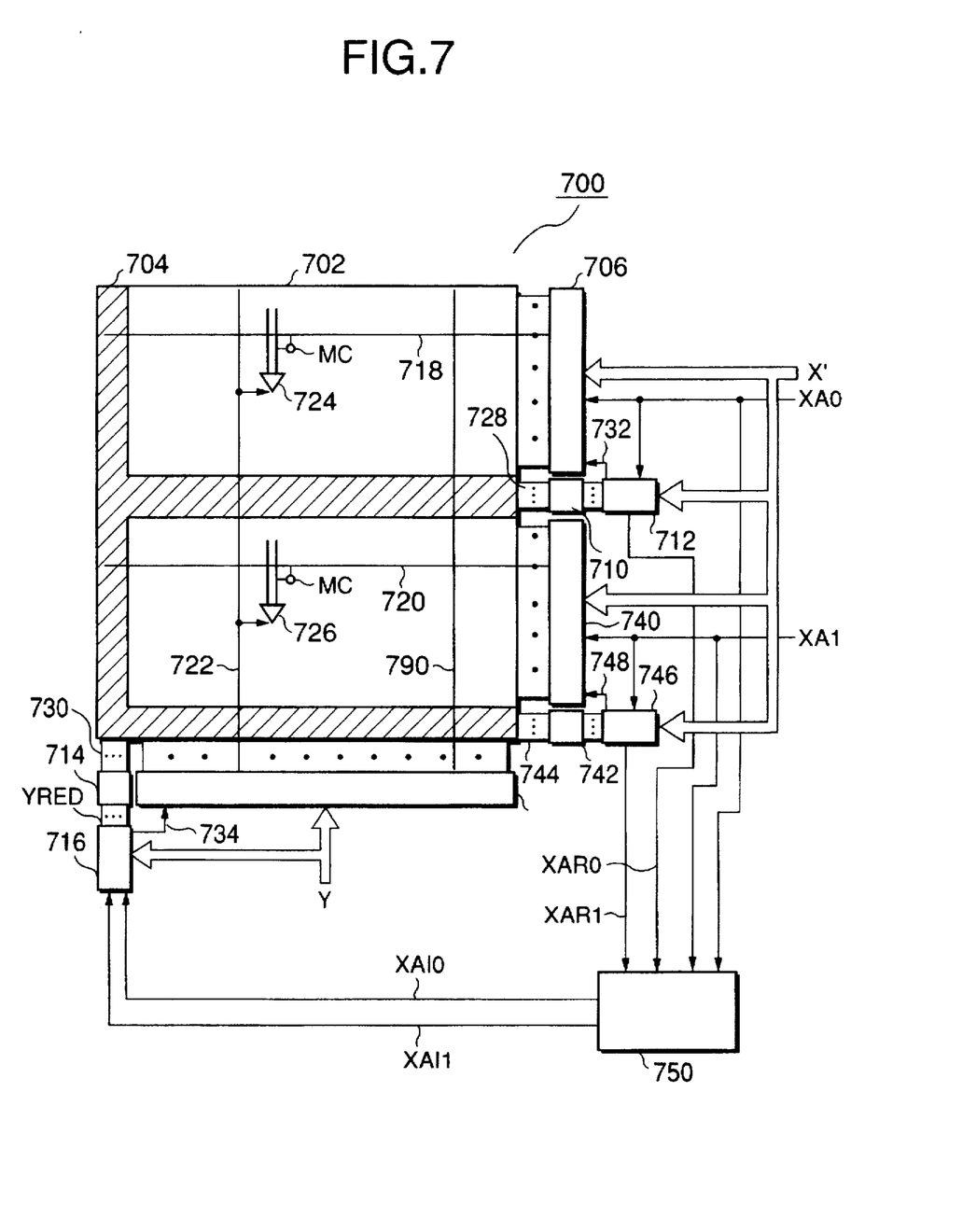
FIG. 7 is a block diagram showing a semiconductor memory device 700 according to a third embodiment of this invention.

The semiconductor memory device 700 according to a third embodiment of this invention shown in FIG. 7 resolves even such a sensitive problem. The semiconductor memory device 700 shown in FIG. 7 will be described in what follows.

The semiconductor memory device 700 according to the third embodiment of this invention has a basically same configuration as that of the semiconductor memory device 600, to which is added a control circuit 750.

The semiconductor memory device 700 has two cell array regions consisting of an upper and lower regions, analogous to the semiconductor memory device 600, and each of these two cell array regions has its own cell array region. However, in the semiconductor memory device 700, the two cell array regions are not physically divided, as is done so in the semiconductor memory device 600. Accordingly, the two cell array regions in the semiconductor memory device 700 simply means the region where the most significant bit of the X address is "0" and the region where it is "1".

Of the two cell array regions, the upper cell array region is provided with a row decoder 706 and a row redundancy decoder 712, and the lower cell array region is provided with a row decoder 740 and a row redundancy decoder 746. An address (X' address) obtained by excluding the most significant bit from an X address is supplied in common to these X-side decoders. In addition, XA0 showing the most significant bit of the X address is supplied to the row decoder 706 and the row redundancy decoder 712, and XA1 showing the most significant bit of the X address is supplied to the row decoder 740 and the row redundancy decoder 746.

The row decoder 706 is activated when XA0 is "1", and activates, in response to the X' address, own word line corresponding to the X' address out of a plurality of word lines. In FIG. 7, only one word line 718 is indicated in the upper cell array region, for convenience. On the other hand, the row decoder 740 is activated when XA1 is "1", and activates, in response to the X' address, one word line corresponding to the X' address out of a plurality of word lines. In FIG. 7, only own word line 720 is indicated in the lower cell array region, for convenience.

Moreover, the row redundancy decoder 712 generates a signal XAR0 which indicates the activation of either one of the redundant word lines 728, and the row redundancy decoder 746 generates a signal XAR1 which indicates the activation of either one of the redundant word lines 744. Although these signals XAR0 and XAR1 are generated by the row redundancy decoders 712 and 746, respectively, in this embodiment, they may be generated by the redundant word line drivers 710 and 742, respectively. In other words, as long as they are signals which show that they are redundant word lines belonging respectively to the upper and lower cell array regions, there is no limitation on the method of their generation.

Figure 8:
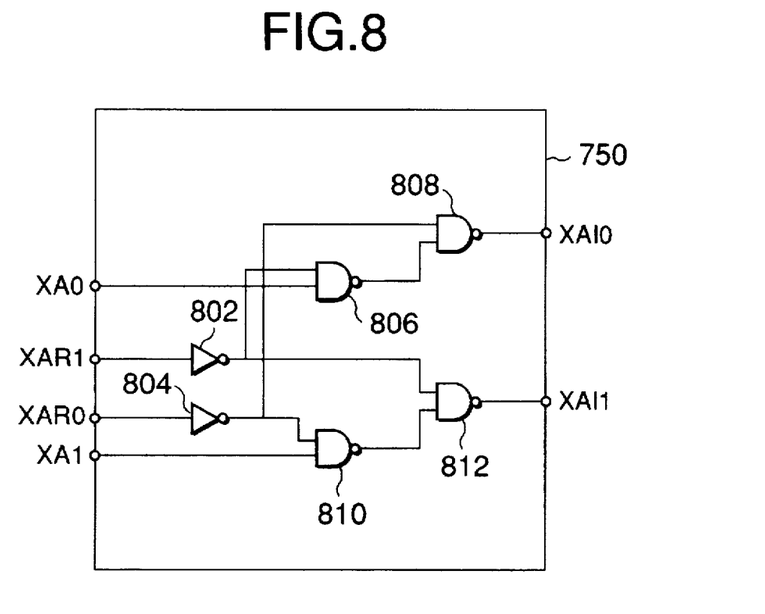
FIG. 8 is a circuit diagram of a control circuit 750 in FIG. 7.

The signals XAR0, XAR1 and XA0, XA1 are supplied to the control circuit 750. The operation of the control circuit 750 whose specific circuit diagram is show in FIG. 8 will be described briefly. First, when a normal word line is selected, namely, when both XAR0 and XAR1 are at a low level, XA0 and XA1 are converted to signals XA10 and XA11, respectively. Next, when the redundant word line 728 is selected, namely, when XAR0 is at a high level and XAR1 is at a low level, XA10 and XA11 go to high and low levels, respectively, regardless of the levels of XA0 and XA1. On the contrary, when the redundant word line 744 is selected, namely, when XAR0 and XAR1 are at low and high levels, respectively, XA0 and XA11 go to low and high levels, respectively, regardless of the levels of XA0 and XA1.

Figure 9:
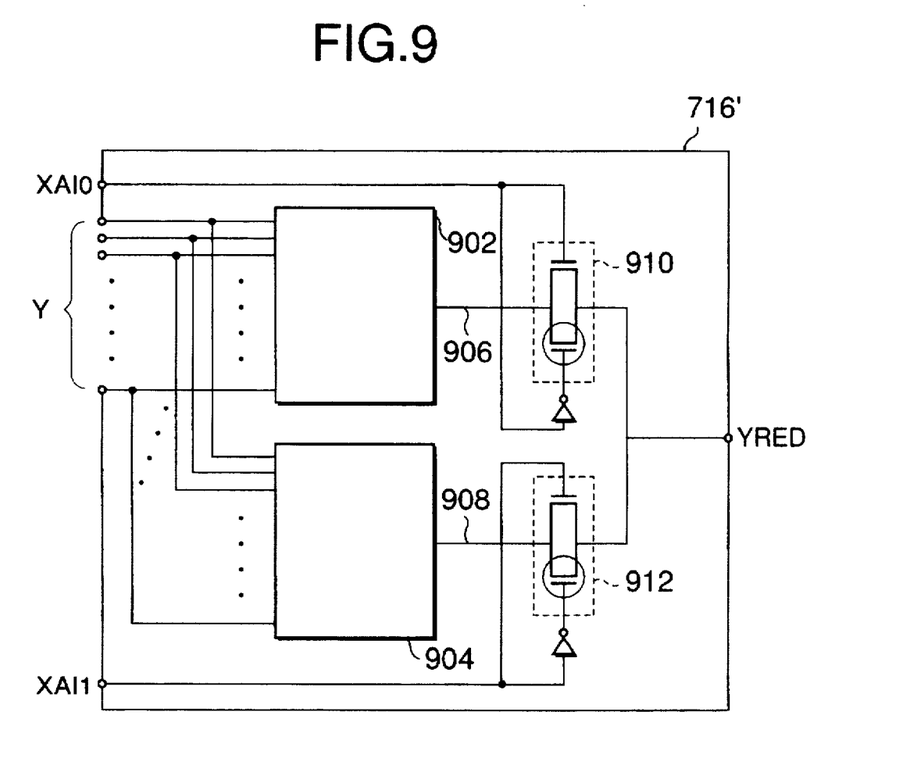
FIG. 9 is a circuit diagram showing a part of a column redundancy decoder 716 in FIG. 7.

Both of these signals XA10 and XA11 thus generated are supplied to the column redundancy decoder 716. Although the circuit configuration of the column redundancy decoder 716 is similar to that of the column redundancy decoder 216, as shown in FIG. 9, the difference from the column redundancy decoder 216 resides in that the signals XA10 and XA11 are used as signals for controlling transfer gates 910 and 912, respectively.

In the semiconductor memory device 700 shown in FIG. 7, one column selection line 722 also activates a plurality of sense amplifiers 724, 726, and the like. In other words, analogous to the semiconductor memory device 100, 200, and 600, a bit line is divided into plural parts in the same column, and the column decoder 708 selects, in response to a Y address, all sense amplifiers connected to the plurality of divided bit lines.

The operations of the row redundancy decoder 712 and 746 are similar to those of the row redundancy decoders 612 and 646.

It is to be noted that the row flexible redundancy method is adopted in the semiconductor memory device 700. That is, when the word line 718 is defective a redundant word line to be used for replacement is not limited to the redundant word line 728, and the redundant word line 744 may also be used. Analogously, when the word line 720 is defective, a redundant word line to be used for replacement is not limited to the redundant word line 744, and the redundant word line 728 may also be used.

Next, the relief operation of a defective bit line by the semiconductor memory device 700 according to this embodiment will be described.

First, the situation in which a normal word line is selected will be described. In this case, since both signals XAR0 and XAR1 are at the low level, XA0 and XA1 go to XA10 and XA11, respectively, as mentioned above, and the operation is the same as in the semiconductor memory devices 200 and 600.

Next, the case of selection of the redundant word line 728 will be described as an example of the situation in which a redundant word line is selected. Here, XAR0 and XAR1 are at high and low levels, respectively, as mentioned above, since the redundant word line 728 is selected. This is because, in this case, XAR0 and XAR1 go to high and low levels, respectively, regardless of the levels of XA0 and XA1 as already mentioned. In other words, the fact that the redundant word line 728 is selected is notified to the column redundancy decoder 716 irrespective of the X address supplied from outside the device. This means that the column redundancy decoder 716 is capable of always knowing the row address (the most significant bit of the row address to be more exact) after replacement, independent of whether a defective word line is replased to a redundant word line belonging to the same cell array region to which the defective word line belongs, or it is replased to a redundant word line belonging to the other cell array region.

Because of this, when there exists defectiveness in a bit line intersecting a redundant word line, the column redundancy decoder 716 can replace it with a redundant bit line belonging to a redundant column selection line regardless of the actual X address supplied from outside the device.

Figure 10:
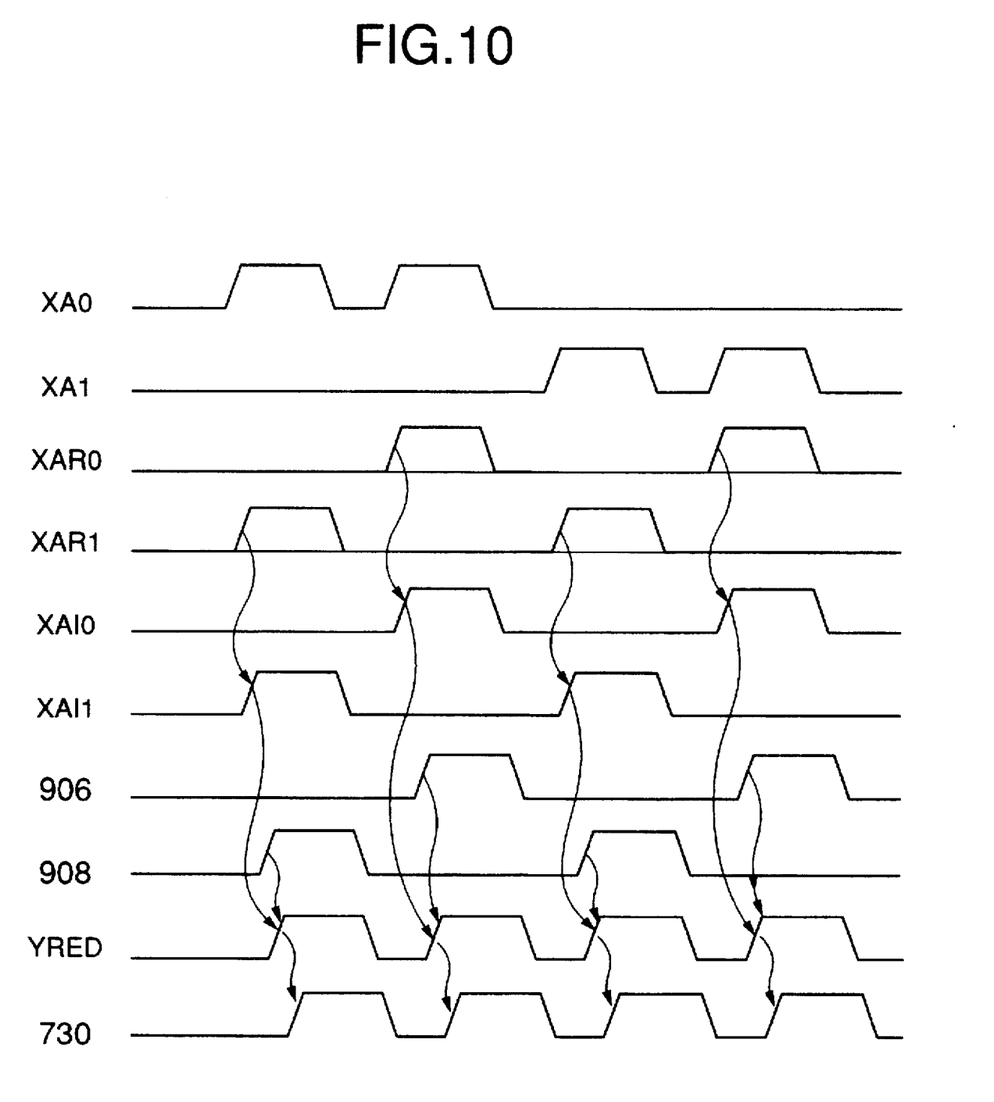
FIG. 10 is a timing chart showing the timings for bit line replacement according to the semiconductor memory device 700.

The operation described above will be understood more clearly with reference to a timing chart shown in FIG. 10. From FIG. 10, it can be seen that XA10 and XA11 are generated in response to XAR0 and XAR1, respectively, regardless of the logical levels of XA0 and XA1. Moreover, a matching signal 906 is generated only when XA10 is in the active state, and in contrast, a matching signal 908 is generated only when XA11 is in the active state.

In this embodiment, XAR0 and XAR1 are utilized as signals indicating that a defective word line has been replace. However, if there are a total of, for example, eight redundant word lines 728, eight signals showing that each of these eight redundant word lines is selected may be adopted. In this case, an eight-input NOR gate may be used instead of an invertor 802 constituting the control circuit 750, and supply these eight signals to the NOR gate. Since the operation of such a control circuit is the same as for the circuit in FIG. 8, it is only necessary to choose the more convenient one depending upon the configuration of the actual circuit.

As described above, according to this embodiment, even in the case where the row flexible redundancy method is adopted concurrently, it is possible to surely enhance the relief efficiency of defective bit lines without giving rise to any inconvenience.

In the above, three embodiments of this invention have been described. However, this invention is not limited to these embodiments, and various modifications and applications of these embodiments are possible as long as they are within the scope of the spirit of this invention.

What is claimed is:

1. A semiconductor memory device comprising, a plurality of column selection lines, at least one redundant column selection line, a column decoder for activating one of said plurality of column selection lines in response to a column address, a first circuit generating a detection signal when the column address of a defective column selection line is supplied, and a second circuit activating said redundant column selection line in response to said detection signal and at least a part of said row address.

2. The semiconductor memory device as claimed in claim 1, wherein said first circuit includes a fuse block storing said column address of said defective column selection line to generate said detection signal.

3. The semiconductor memory device as claimed in claim 2, wherein said second circuit including a transfer gate controlled by said part of said row address to transfer said detection signal to activate said redundant column selection line.

4. The semiconductor memory device as claimed in claim 1, wherein said column decoder inactivates none of said plurality of column selection lines when said redundant column selection line is activated.

5. The semiconductor memory device as claimed in claim 1, wherein said part of said row address includes a most significant bit of said row address.

6. A semiconductor memory device comprising:

a plurality of word lines including at least first and second word lines;

a plurality of bit lines including at least first and second bit lines;

a plurality of redundant bit lines including at least first and second redundant bit lines;

a plurality of memory cells each of which is disposed on intersections of said word lines and bit lines;

a plurality of redundant memory cells each of which is disposed on intersections of said word lines and redundant bit lines;

a plurality of column selection lines including at least a first column selection line; said first and second bit lines being selected when said first column selection line is activated, a redundant column selection line; said first and second redundant bit lines being selected when said redundant column selection line is activated, a column decoder activating said first column selection line in response to a first column address when said first word line is activated; and a column redundancy decoder activating said redundant column selection line in response to said first column address when said second word line is activated.

7. The semiconductor memory device as claimed in claim 6, wherein said first word line intersects said first bit line and said first redundant bit line without intersecting said second bit line and said second redundant bit line, said second word line intersecting said second bit line and said second redundant bit line without intersecting said first bit line and said first redundant bit line.

8. The semiconductor memory device as claimed in claim 7, wherein said column decoder is inhibited to activate said first column selection line in response to said first column address when said second word line is activated.

9. The semiconductor memory device as claimed in claim 7, wherein said plurality of bit lines further includes third and fourth bit lines, said plurality of column selection lines further including a second column selection line, said third and fourth bit lines being selected when said second column selection line is activated, said column decoder activating said second column selection line in response to a second column address when said second word line is activated, said column redundancy decoder activating said redundant column selection line in response to said second column address when said first word line is activated.

10. The semiconductor memory device as claimed in claim 9, wherein said column decoder is inhibited to activate said first column selection line in response to said first column address when said second word line is activated and inhibited to activate said second column selection line in response to said second column address when said first word line is activated.

11. The semiconductor memory device as claimed in claim 9, wherein said first word line further intersects said third bit line without intersecting said fourth bit line, said second word line further intersecting said fourth bit line without intersecting said third bit line.

12. The semiconductor memory device as claimed in claim 9, wherein said column redundancy decoder includes first and second fuse blocks, said first fuse block activating a first matching signal in response to said first column address, and said second fuse block activating a second matching signal in response to said second column address.

13. The semiconductor memory device as claimed in claim 12, wherein said column redundancy decoder further includes first and second transfer gates, said first transfer gate being activated to transfer said first matching signal to said redundant column selection line responsive to said second word line being activated, said second transfer gate being activated to transfer said second matching signal to said redundant column selection line responsive to said first word line being activated.

14. The semiconductor memory device as claimed in claim 6, wherein said second bit line is defective.

15. The semiconductor memory device as claimed in claim 9, wherein said second and third bit lines are defective.

* * * * *